(12) United States Patent
He et al.

(10) Patent No.: US 12,375,087 B2
(45) Date of Patent: Jul. 29, 2025

(54) CLOCK MANAGEMENT APPARATUS, CLOCK FREQUENCY DIVISION MODULE AND SYSTEM-ON-CHIP

(71) Applicant: ESPRESSIF SYSTEMS (SHANGHAI) CO., LTD., Shanghai (CN)

(72) Inventors: Yaqian He, Shanghai (CN); Li Tong, Shanghai (CN)

(73) Assignee: ESPRESSIF SYSTEMS (SHANGHAI) CO., LTD., Shanghai (CN)

( * ) Notice: Subject to any disclaimer, the term of this patent is extended or adjusted under 35 U.S.C. 154(b) by 96 days.

(21) Appl. No.: 18/548,044

(22) PCT Filed: Dec. 31, 2021

(86) PCT No.: PCT/CN2021/143716
§ 371 (c)(1),
(2) Date: Aug. 25, 2023

(87) PCT Pub. No.: WO2022/179309
PCT Pub. Date: Sep. 1, 2022

(65) Prior Publication Data
US 2024/0146310 A1 May 2, 2024

(30) Foreign Application Priority Data
Feb. 25, 2021 (CN) .......................... 202110253009.3

(51) Int. Cl.
*H03L 7/00* (2006.01)
*G06F 1/08* (2006.01)
(Continued)

(52) U.S. Cl.
CPC .................. *H03L 7/00* (2013.01); *G06F 1/08* (2013.01); *G06F 1/12* (2013.01); *H03K 3/037* (2013.01); *H03K 5/22* (2013.01)

(58) Field of Classification Search
CPC ........................................................ H03L 7/00
(Continued)

(56) References Cited

U.S. PATENT DOCUMENTS 6,028,816 A    2/2000 Takemae et al.

FOREIGN PATENT DOCUMENTS

CN          1877997 A    * 12/2006
CN        102129269 A       7/2011
(Continued)

OTHER PUBLICATIONS

International Search Report of Corresponding PCT Application No. PCT/CN2021/143716.

*Primary Examiner* — Tomi Skibinski
(74) *Attorney, Agent, or Firm* — Aird & McBurney LP

(57) ABSTRACT

Provided is a clock management apparatus wherein the clock management apparatus includes a clock synchronization signal generator, a plurality of clock gating units and clock frequency division modules; a synchronization signal of a predetermined period is generated by the clock synchronization signal generator; each of the clock gating units is connected in series with a corresponding one of the clock frequency division modules to form a signal processing branch; and the signal processing branches are connected in parallel to receive a source clock signal respectively, the clock gating unit controls the on-off switch of the signal processing branch, and the clock frequency division modules are configured to perform phase adjustment on the clock signals of the signal processing branches after receiving the synchronization signal output by the clock synchronization
(Continued)

signal generator, and to adjust the clock signals of the signal processing branches from an asynchronous state to a synchronous state.

19 Claims, 2 Drawing Sheets

(51) Int. Cl.
 *G06F 1/12* (2006.01)
 *H03K 3/037* (2006.01)
 *H03K 5/22* (2006.01)
(58) Field of Classification Search
 USPC .......................................................... 327/144
 See application file for complete search history.

(56) References Cited

FOREIGN PATENT DOCUMENTS

| | | | |
|---|---|---|---|
| CN | 102624382 A | 8/2012 | |
| CN | 104158515 A | 11/2014 | |
| CN | 104300969 A | 1/2015 | |
| CN | 104467834 A | 3/2015 | |
| CN | 110750129 A | 2/2020 | |
| CN | 111010176 A | 4/2020 | |
| CN | 111313893 A | 6/2020 | |
| CN | 111446960 A | 7/2020 | |
| CN | 113037251 A | 6/2021 | |

\* cited by examiner

CLOCK MANAGEMENT APPARATUS, CLOCK FREQUENCY DIVISION MODULE AND SYSTEM-ON-CHIP

CROSS-REFERENCE TO RELATED APPLICATIONS

This application is the U.S. National Phase Application under 35 U.S.C. § 371 of International Patent Application No. PCT/CN2021/143716 filed on Dec. 31, 2021, which claims priority to Chinese Patent Application CN202110253009.3 filed on Feb. 25, 2021. The disclosures of the aforementioned applications are hereby incorporated by reference in their entireties.

TECHNICAL FIELD

This disclosure relates to the field of integrated circuit technologies, and in particular, to a clock management apparatus, a clock frequency division module, and a system-on-chip.

BACKGROUND

System-on-chip (SoC) refers to a technology in which a complete system is integrated on a single chip, and all or some necessary electronic circuits are grouped into packages. Currently, a SoC chip divides different functional modules into different clock domains, to meet the requirement of low power consumption. Different clock domains operate at different clock frequencies, and it is selectable to adjust an operating clock frequency of a certain clock domain according to the current task load, or to turn off a clock of the module that is not involved in the current tasks. However, the turn-off of the clock and the adjustment of the frequency often cause phase offset between clocks of different clock domains, so that the transmission of signals across the clock domains has relatively large circuit and timing overheads, resulting in increased chip area and degraded performance.

In view of this situation, an existing adjustment method is as follows: when each clock is turned on or turned off or frequency adjustment is performed, all clocks are turned off first, and then are turned on together until the frequency adjustment setting is completed, thereby achieving the purpose of phase consistency. In such a method, the clocks are turned off in the adjustment process, the process is complex, and the performance of the system is affected.

Therefore, it is necessary to provide a solution to solve the problem of phase offset of the operating clock of each clock domain of the system-on-chip after frequency adjustment or on-off switching of the operating clocks.

SUMMARY

To resolve the foregoing problems, the present disclosure provides a clock management apparatus, including a clock synchronization signal generator, a plurality of clock gating units, and a plurality of clock frequency division modules; wherein the clock synchronization signal generator is configured to generate a synchronization signal of a predetermined period; the plurality of clock gating units are in one-to-one correspondence with the plurality of clock frequency division modules, and each of the plurality of clock gating units is connected in series with a corresponding one of the plurality of clock frequency division modules to form a signal processing branch; a plurality of the signal processing branches are connected in parallel and configured to receive a source clock signal respectively; the clock gating unit is configured to control an on-off switch of the signal processing branch, and the clock frequency division module is configured to perform phase adjustment on a clock signal of the signal processing branch after receiving a synchronization signal output by the clock synchronization signal generator, to adjust clock signals of the plurality of signal processing branches from an asynchronous state to a synchronous state.

Optionally, clock signals output by the plurality of signal processing branches are used as operating clocks of a plurality of clock domains respectively.

Optionally, the predetermined period is a common multiple of periods of the operating clocks of the plurality of clock domains.

Optionally, the clock frequency division module includes a state machine, a synchronization signal delay circuit, and a clock generation circuit;
wherein the synchronization signal delay circuit is configured to delay a synchronization signal after receiving the synchronization signal output by the clock synchronization signal generator;
the state machine is configured to control the clock generation circuit to, after receiving the delayed synchronization signal, adjust the phase of the output clock in response to the clock signals of the plurality of current signal processing branches are in the asynchronous state.

Optionally, the clock frequency division module further includes a counter and a comparator;
wherein the counter is configured to perform periodic counting under control of the state machine to determine a current count value;
the comparator is configured to compare the current count value with a maximum count threshold of the clock frequency division module, and output state information about whether the current state is a synchronous state; wherein the comparator is configured to output the state information that the current state is the synchronous state in response to the current count value being consistent with the maximum count threshold, and output the state information that the current state is the asynchronous state in response to the current count value being inconsistent with the maximum count threshold;
the state machine is configured to receive the state information sent by the comparator;
wherein the maximum count threshold is a value obtained by subtracting 1 from a preset frequency division ratio of the clock frequency division module.

Optionally, the clock frequency division module further includes a frequency division ratio register configured to store the maximum count threshold.

Optionally, when a value of the preset frequency division ratio is adjusted, a value of the maximum count threshold stored in the frequency division ratio register is modified in response to the clock signal being in the synchronous state and the clock frequency division module receiving the synchronization signal.

Optionally, the state machine is configured to switch to the asynchronous state after receiving the state information that the current state is the asynchronous state, and control the clock generation circuit to turn off the clock output; after the counter counts to the maximum count threshold, the state machine is configured to switch to a phase adjustment state, and the counter records a current count value as a phase offset value when a synchronization signal occurs; and when the counter continues to count to the phase offset value, the state machine is configured to control the clock generation circuit to turn on the clock output.

Optionally, the clock generation circuit is implemented by using a clock gating unit or a flip-flop.

Optionally, the state machine is configured to switch to the asynchronous state in response to a signal corresponding to the clock gating unit being enabled or reset.

Optionally, the synchronization signal delay circuit is configured to, after receiving the synchronization signal output by the synchronization signal generator, delay the synchronization signal by a multiple of a period of the source clock according to a preset frequency division clock phase offset value.

The present disclosure further provides a clock frequency division module, including a state machine, a synchronization signal delay circuit, and a clock generation circuit;

wherein the synchronization signal delay circuit is configured to delay a synchronization signal after receiving the synchronization signal;

the state machine is configured to, after receiving the delayed synchronization signal, control the clock generation circuit to adjust a phase of the output clock in response to a current clock signal and other clock signals being in an asynchronous state.

Optionally, the clock frequency division module further includes a counter and a comparator;

wherein the counter is configured to perform periodic counting under control of the state machine to determine a current count value;

the comparator is configured to compare the current count value with a maximum count threshold of the clock frequency division module, and output state information about whether a current state is a synchronous state; the comparator is configured to output the state information that the current state is a synchronous state in response to the current count value being consistent with the maximum count threshold, and output the state information that the current state is an asynchronous state In response to the current count value being inconsistent with the maximum count threshold;

the state machine is configured to receive the state information sent by the comparator;

wherein the maximum count threshold is a value obtained by subtracting 1 from a preset frequency division ratio of the clock frequency division module.

The present disclosure further provides a system-on-chip including any of the above-mentioned clock management apparatuses, wherein the clock management apparatus is configured to output clock signals for use in the same or different functional modules of the system-on-chip.

According to the clock management apparatus, the clock frequency division module and the system-on-chip provided by the present disclosure, the clock management apparatus includes a clock synchronization signal generator, a plurality of clock gating units, and a plurality of clock frequency division modules; a synchronization signal of a predetermined period is generated by the clock synchronization signal generator; the plurality of clock gating units are in one-to-one correspondence with the plurality of clock frequency division modules, and each of the plurality of clock gating units is connected in series with a corresponding one of the plurality of clock frequency division modules to form a signal processing branch; and the plurality of signal processing branches are connected in parallel to receive a source clock signal respectively, the clock gating unit controls the on-off switch of the signal processing branch, and the clock frequency division module is configured to perform phase adjustment on the clock signal of the signal processing branch after receiving the synchronization signal output by the clock synchronization signal generator, to adjust the clock signals of the plurality of signal processing branches from the asynchronous state to the synchronous state. The clock management apparatus, the clock frequency division module, and the system-on-chip provided in the present disclosure realize a controllable phase of the operating clock of each clock domain and realize adjustment without shutting down the system, simplifying the adjustment process and improving the performance of the system.

BRIEF DESCRIPTION OF THE DRAWINGS

In the following, the present disclosure will be further explained on the basis of embodiments with reference to the attached drawings.

DETAILED DESCRIPTION OF THE PREFERRED EMBODIMENTS

The apparatus according to the present disclosure will be described in detail below with reference to the accompanying drawings and specific embodiments. It should be understood that the embodiments shown in the accompanying drawings and described hereinafter are merely illustrative and not intended to limit the present disclosure.

Figure 1:
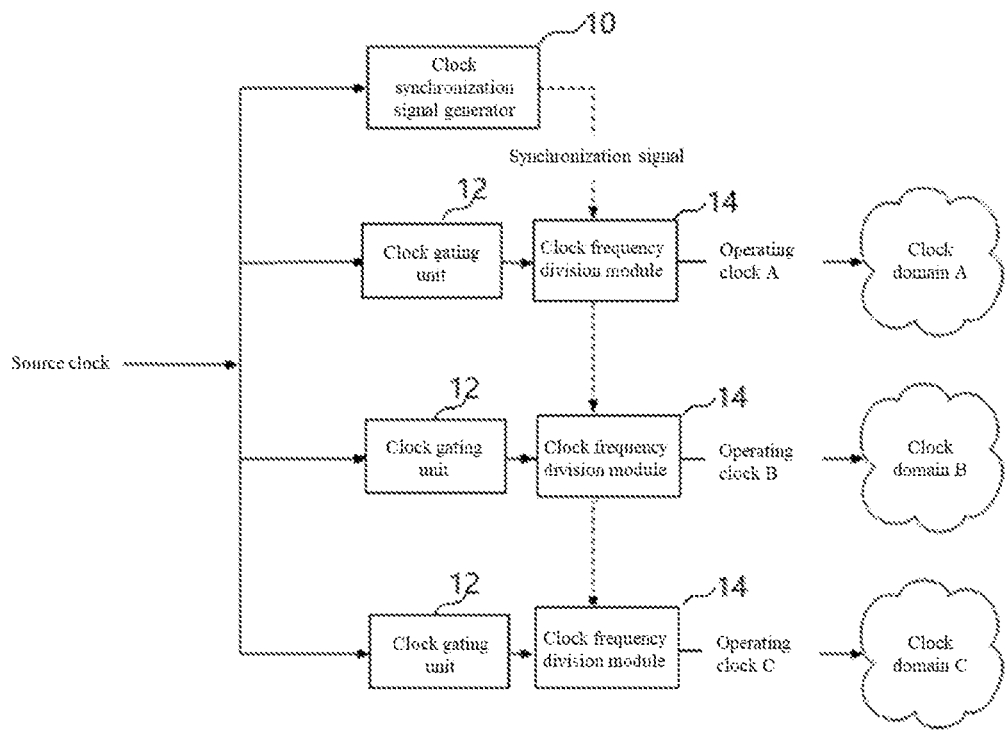
FIG. 1 schematically shows a structural block diagram of a clock management apparatus according to a specific embodiment of the present disclosure.

FIG. 1 is a structural block diagram of a clock management apparatus according to a specific embodiment of the present disclosure. In this embodiment, the clock management apparatus 1 includes a clock synchronization signal generator 10, a plurality of clock gating units 12, and a plurality of clock frequency division modules 14.

The clock synchronization signal generator 10 is configured to generate a synchronization signal of a predetermined period. The plurality of clock gating units 12 are in one-to-one correspondence with the plurality of clock frequency division modules 14, and each of the plurality of clock gating units 12 is connected in series with a corresponding one of the plurality of clock frequency division modules 14 to form a signal processing branch. A plurality of the signal processing branches are connected in parallel and configured to receive a source clock signal respectively. The clock gating unit 12 is configured to control an on-off switch of the signal processing branch, and the clock frequency division module 14 is configured to perform phase adjustment on a clock signal of the signal processing branch after receiving a synchronization signal output by the clock synchronization signal generator 10, to adjust clock signals of the plurality of signal processing branches from an asynchronous state to a synchronous state.

It can be understood that an operating clock of a respective clock domain is obtained from the source clock through the switch control of the clock gating unit and the clock frequency division module. That is, clock signals output by the plurality of signal processing branches are used as operating clocks of the plurality of clock domains respectively.

The clock synchronization signal generator may be formed by a source clock driven counter, may generate a pulse synchronization signal of a predetermined period according to software configuration, and may be used as a universal reference object for all clocks on the chip. The predetermined period may be a common multiple of the periods of the operating clocks of the plurality of clock domains. It can be understood that the period of the operating clock of each clock domain is adjustable.

The present disclosure provides a clock management apparatus that realizes a controllable phase of the operating clock for each clock domain and realizes adjustment without shutting down the system, simplifying the adjustment process and improving the performance of the system.

Figure 2:
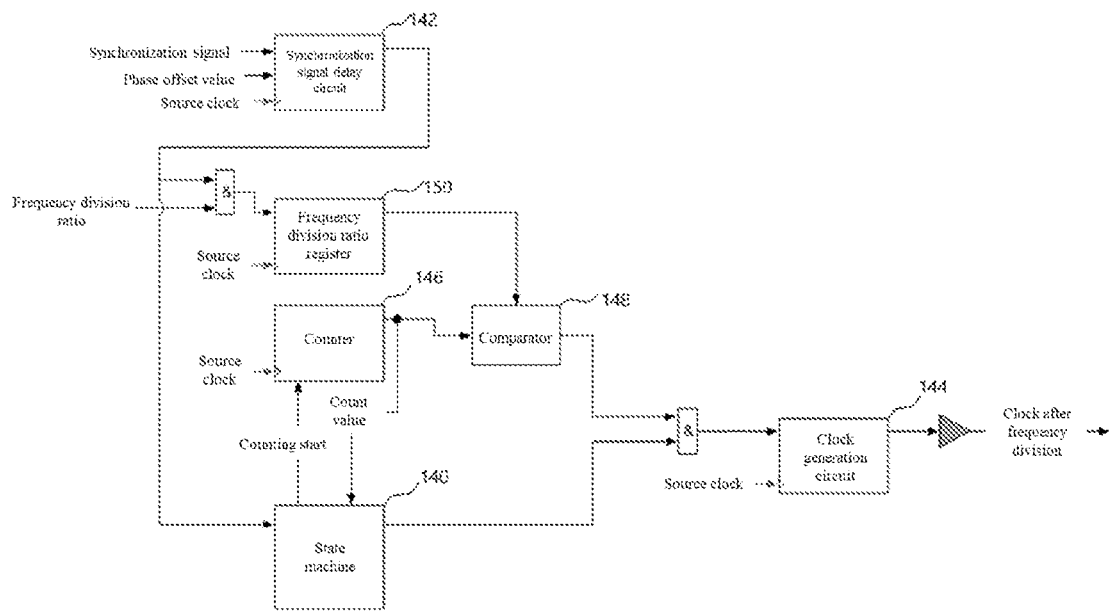
FIG. 2 schematically shows a schematic diagram of a clock frequency division module according to the present disclosure.

As a specific implementation, the clock frequency division module 14 provided in the present disclosure may include a state machine 140, a synchronization signal delay circuit 142 and a clock generation circuit 144. FIG. 2 shows a schematic diagram of a clock frequency division module according to the present disclosure. The synchronization signal delay circuit 142 is configured to delay a synchronization signal after receiving the synchronization signal output by the synchronization signal generator 10. The state machine 140 is configured to control the clock generation circuit 144 to, after receiving the delayed synchronization signal, adjust the phase of the output clock in response to the clock signals of the current plurality of signal processing branches being in the asynchronous state.

Further, the clock frequency division module 14 provided by the present disclosure may further include a counter 146 and a comparator 148. The counter 146 is configured to perform periodic counting under the control of the state machine, to determine a current count value. The comparator 148 is configured to compare the current count value with a maximum count threshold of the clock frequency division module, and output state information about whether the current state is a synchronous state. When the current count value is consistent with the maximum count threshold, the comparator 148 is configured to output the state information that the current state is a synchronous state; and when the current count value is inconsistent with the maximum count threshold, the comparator 148 is configured to output the state information that the current state is an asynchronous state. The state machine 140 is configured to receive the state information sent by the comparator 148. The maximum count threshold is a value obtained by subtracting 1 from a preset frequency division ratio of the clock frequency division module. For example, for a clock whose operating clock is a divide-by-5 clock, the corresponding preset frequency division ratio is 5, and the maximum count threshold is $5-1=4$.

The clock frequency division module may further include a frequency division ratio register 150 configured to store the above maximum count threshold. A value of the preset frequency division ratio may be set according to actual conditions. As a specific implementation, when the value of the preset frequency division ratio is adjusted, the value of the maximum count threshold stored in the frequency division ratio register is modified in response to the clock signal being in the synchronous state and the clock frequency division module receiving the synchronization signal. When a frequency division ratio of the frequency divider is adjusted, the maximum count threshold stored in the frequency division ratio register is updated by a new frequency division coefficient only when the frequency divider is in the synchronous state and receives the synchronization signal.

The state machine 140 may be a finite state machine configured to control the clock frequency division module. The counter 146 performs periodic counting according to a preset frequency division ratio to determine a current count value. The comparator compares the current count value with the maximum count threshold to determine whether the current state is a synchronous state or an asynchronous state. When the current count value is consistent with the maximum count threshold, the current state is the synchronous state. When the current count value is inconsistent with the maximum count threshold, the current state is the asynchronous state. The state machine 140 controls the clock generation circuit 144 to adjust the phase of the output clock according to the state information obtained by the comparator.

The state machine is configured to switch to the asynchronous state after receiving the state information that the current state is the asynchronous state, and control the clock generation circuit to turn off the clock output. After the counter counts to the maximum count threshold, the state machine is configured to switch to the phase adjustment state, and the counter records a current count value as a phase offset value when a synchronization signal occurs. When the counter continues to count to the phase offset value, the state machine controls the clock generation circuit to turn on the clock output. The clock generation circuit may be implemented by using a clock gating unit, or may be implemented by using a flip-flop, which does not affect the implementation of the present disclosure.

Figure 3:
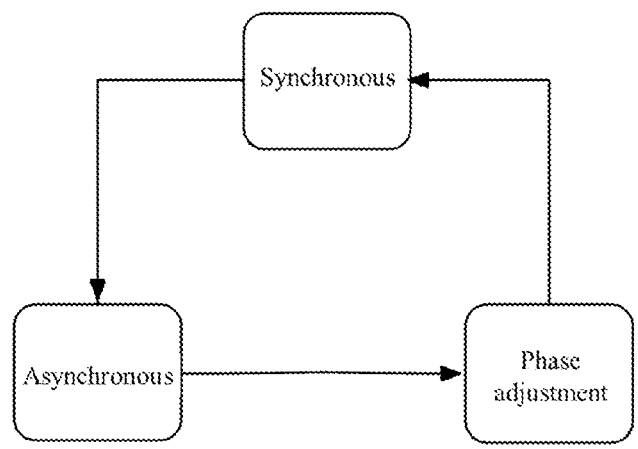
FIG. 3 schematically shows a state diagram of a state machine in the clock frequency division module.

Referring to FIG. 3, which shows a state diagram of the state machine in the clock frequency division module, the states of state machine in the clock frequency division module include a synchronous state, an asynchronous state and a phase adjustment state. When the signal corresponding to the clock gating unit is enabled or reset, the state of the state machine switches to an asynchronous state. When the clock frequency division module receives the synchronization signal and the count of the counter reaches the maximum count threshold, the state of the state machine switches to the synchronous state. After the phase adjustment for the asynchronous state, the state of the state machine switches to the synchronous state.

Specifically, when the chip is reset or the clock is turned off, the state machine is in an asynchronous state. After receiving the synchronization signal output by the synchronization signal generator, the synchronization signal delay circuit delays the synchronization signal. The comparator determines whether the current state is the synchronous state according to the count value of the current counter. If the synchronous state is determined, the state machine switches to the synchronous state. If the asynchronous state is determined, the counter records the current count value as the phase offset value, and enters the phase adjustment state. The count limit of the counter is adjusted to the phase offset value, and after the phase adjustment is completed, the state machine enters the synchronous state.

Figure 4:
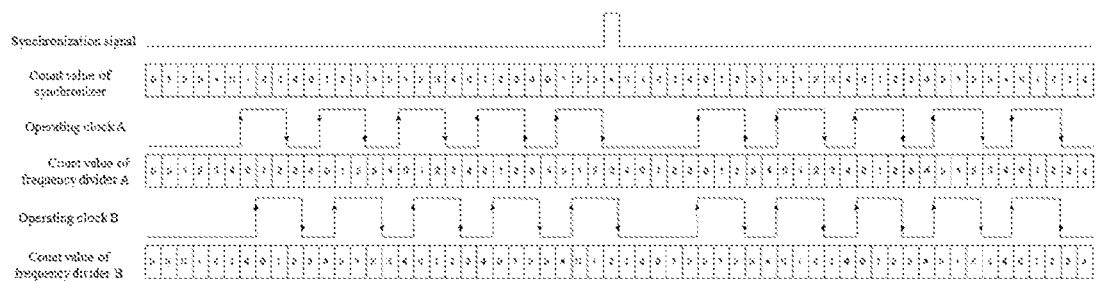
FIG. 4 shows a schematic diagram of phase adjustment of the clock management apparatus according to the present disclosure.

Referring to FIG. 4, which is a schematic diagram of phase adjustment of the clock management apparatus according to the present disclosure, where both an operating clock A and an operating clock B are divide-by-5 clocks of the source clock, and have a phase offset. Phase synchronization is achieved after calibration by the synchronization signal. As shown in FIG. 4, initially the operating clock A and operating clock B are divide-by-5 periodic signals, with a corresponding counter counting from 0 to 4 for a period, which corresponds to a rising edge of the signal when the counter counts to 0, and corresponds to a falling edge of the signal when the counter counts to 3. It can be seen that there is a phase offset between the operating clock A and the operating clock B, the corresponding preset frequency division ratios are both 5, and the maximum count thresholds are both 4.

As shown in FIG. 4, after receiving the synchronization signal at the clock frequency division module, for the frequency divider A, the current count value recorded by the counter is 3, and the comparator compares whether the current count value is consistent with the maximum count threshold 4. For the frequency divider B, the current count value recorded by the counter is 2, and the comparator compares whether the current count value is consistent with the maximum count threshold 4. In this embodiment, the current count value is inconsistent with the maximum count threshold 4, and thus it is determined that the current state is the asynchronous state.

After it is determined that the current state is the asynchronous state, the state machine switches from the synchronous state to the asynchronous state, and turns off the clock output. Referring to FIG. 4, the clock signal outputs corresponding to the operating clock A and the operating clock B are both 0. After this round of counting by the counter is completed, that is, the count reaches the maximum count threshold 4, the state machine switches to the phase adjustment state. The counter records the current count value as the phase offset value when the synchronization signal occurs. In this embodiment, for the frequency divider A, if the current count value corresponding to the frequency divider A is 3 when the synchronization signal occurs, the phase offset value is 3. After counting from 0 to the maximum value 4 in the previous round, the counter of the frequency divider A performs phase adjustment according to the phase offset value of 3, that is, continues counting from 0 to 3 in the next round. For the frequency divider B, if the current count value corresponding to the frequency divider B is 2 when the synchronization signal occurs, the phase offset value is 2. After counting from 0 to the maximum value 4 in the previous round, the counter of the frequency divider B performs phase adjustment according to the phase offset value of 2, that is, continues counting from 0 to 2 in the next round. After each of the counter of the frequency divider A and the counter of the frequency divider B counts to the respective phase offset value, the state machine is switched to the synchronous state, and then the clock output is turned on, and at this time the output operating clock A and the operating clock B can be synchronized.

The synchronization signal delay circuit is configured to, after receiving the synchronization signal output by the synchronization signal generator, delay the synchronization signal by a multiple of a period of the source clock according to a preset frequency division clock phase offset value. In this disclosure, phase controllability is achieved by delaying the synchronization signal. For example, if there is a phase offset between the clock of the first clock domain and the clock of the second clock domain, the synchronization signal received by the first clock domain is delayed by one period, and in this way, if the clock frequency division module maintains synchronization with the delayed synchronization signal, the clock output from the first clock domain and the clock output from the second clock domain also have a phase offset by one period.

In addition, the disclosure further provides a clock frequency division module. Referring to FIG. 2, the clock division frequency module 14 provided in the present disclosure may include a state machine 140, a synchronization signal delay circuit 142, and a clock generation circuit 144. FIG. 2 shows a schematic diagram of the clock frequency division module according to the present disclosure. The synchronization signal delay circuit 142 is configured to delay a synchronization signal after receiving a synchronization signal, and achieve phase controllability by delaying the synchronization signal. For example, if a person skilled in the art expects that a clock signal of a clock domain A to have a phase offset compared to a clock signal of another clock domain, a phase offset value of a frequency divider A may be set, and a synchronization signal received by the clock domain A is delayed by one period, so that the clock domain A can have a phase offset by one period compared with another clock domain. The state machine 140 is configured to control the clock generation circuit 144 to, after receiving the delayed synchronization signal, adjust a phase of the output clock when the clock signals of the plurality of signal processing branches are in the asynchronous state.

Further, the clock frequency division module 14 provided in this disclosure may further include a counter 146 and a comparator 148. The counter 146 is configured to perform periodic counting under the control of the state machine and determine a current count value. The comparator 148 is configured to compare the current count value with a maximum count threshold of the clock frequency division module, and output state information about whether a current state is synchronized; when the current count value is consistent with the maximum count threshold, output state information that the current state is a synchronous state; and when the current count value is inconsistent with the maximum count threshold, output state information that the current state is an asynchronous state. The state machine 140 is configured to receive the state information sent by the comparator 148.

It can be understood that the clock frequency division module provided in this embodiment of the present disclosure may be used independently or as one of the modules of the above-described clock management apparatus, and its specific structure and function are referred to the above and will not be repeated herein.

In addition, this present disclosure further provides a system-on-chip, including any one of the above-described clock management apparatuses, and the clock management apparatus outputs clock signals for use in the same or different functional modules of the system-on-chip.

The present disclosure provides the clock management apparatus, the clock frequency division module, and the system-on-chip that realize a controllable phase of the operating clock for each clock domain and realize adjustment without shutting down the system, simplifying the adjustment process and improving the performance of the system.

While various embodiments of various aspects of the disclosure have been described for the purpose of the disclosure, it shall not be understood that the teaching of the disclosure is limited to these embodiments. The features disclosed in a specific embodiment are therefore not limited to that embodiment, but can be combined with the features disclosed in different embodiments. For example, one or more features and/or operations of the method according to the present disclosure described in one embodiment can also be applied individually, in combination or as a whole in another embodiment. It can be understood by those skilled in the art that more optional embodiments and variations are possible, and that various changes and modifications can be made to the system described above, without departing from the scope defined by the claims of the present disclosure.

The invention claimed is:

1. A clock management apparatus, comprising a clock synchronization signal generator, a plurality of clock gating units, and a plurality of clock frequency division modules;
wherein the clock synchronization signal generator is configured to generate a synchronization signal of a predetermined period;
the plurality of clock gating units are in one-to-one correspondence with the plurality of clock frequency division modules, and each of the plurality of clock gating units is connected in series with a corresponding one of the plurality of clock frequency division modules to form a signal processing branch; a plurality of the signal processing branches are connected in parallel and configured to receive a source clock signal respectively; the clock gating unit is configured to control an on-off switch of the signal processing branch, and the clock frequency division module is configured to perform phase adjustment on a clock signal of the signal processing branch after receiving a synchronization signal output by the clock synchronization signal generator, to adjust clock signals of the plurality of signal processing branches from an asynchronous state to a synchronous state.

2. The clock management apparatus according to claim 1, wherein clock signals output by the plurality of signal processing branches are used as operating clocks of a plurality of clock domains respectively.

3. The clock management apparatus according to claim 2, wherein the predetermined period is a common multiple of periods of the operating clocks of the plurality of clock domains.

4. The clock management apparatus according to claim 1, wherein the clock frequency division module comprises a state machine, a synchronization signal delay circuit, and a clock generation circuit;
wherein the synchronization signal delay circuit is configured to delay a synchronization signal after receiving the synchronization signal output by the clock synchronization signal generator;
the state machine is configured to control the clock generation circuit to, after receiving the delayed synchronization signal, adjust the phase of the output clock in response to the clock signals of the plurality of current signal processing branches being in the asynchronous state.

5. The clock management apparatus according to claim 4, wherein the clock frequency division module further comprises a counter and a comparator;
wherein the counter is configured to perform periodic counting under control of the state machine to determine a current count value;
the comparator is configured to compare the current count value with a maximum count threshold of the clock frequency division module, and output state information about whether the current state is a synchronous state; wherein the comparator is configured to output the state information that the current state is the synchronous state in response to the current count value being consistent with the maximum count threshold, and output the state information that the current state is the asynchronous state in response to the current count value being inconsistent with the maximum count threshold;
the state machine is configured to receive the state information sent by the comparator;
wherein the maximum count threshold is a value obtained by subtracting 1 from a preset frequency division ratio of the clock frequency division module.

6. The clock management apparatus according to claim 5, wherein the clock frequency division module further comprises a frequency division ratio register configured to store the maximum count threshold.

7. The clock management apparatus according to claim 6, wherein when a value of the preset frequency division ratio is adjusted, a value of the maximum count threshold stored in the frequency division ratio register is modified in response to the clock signal being in the synchronous state and the clock frequency division module receiving the synchronization signal.

8. The clock management apparatus according to claim 5, wherein the state machine is configured to switch to the asynchronous state after receiving the state information that the current state is the asynchronous state, and control the clock generation circuit to turn off the clock output;
after the counter counts to the maximum count threshold, the state machine is configured to switch to a phase adjustment state, and the counter records a current count value as a phase offset value when a synchronization signal occurs; and when the counter continues to count to the phase offset value, the state machine is configured to control the clock generation circuit to turn on the clock output.

9. The clock management apparatus according to claim 8, wherein the clock generation circuit is implemented by using a clock gating unit or a flip-flop.

10. The clock management apparatus according to claim 4, wherein the state machine is configured to switch to the asynchronous state in response to a signal corresponding to the clock gating unit being enabled or reset.

11. The clock management apparatus according to claim 4, wherein the synchronization signal delay circuit is configured to, after receiving the synchronization signal output by the synchronization signal generator, delay the synchronization signal by a multiple of a period of the source clock according to a preset frequency division clock phase offset value.

12. A clock frequency division module, comprising a state machine, a synchronization signal delay circuit, and a clock generation circuit;
wherein the synchronization signal delay circuit is configured to delay a synchronization signal after receiving the synchronization signal;
the state machine is configured to, after receiving the delayed synchronization signal, control the clock generation circuit to adjust a phase of the output clock in response to a current clock signal and other clock signals being in an asynchronous state;
wherein the clock frequency division module further comprises a counter and a comparator;
wherein the counter is configured to perform periodic counting under control of the state machine to determine a current count value;
the comparator is configured to compare the current count value with a maximum count threshold of the clock frequency division module, and output state information about whether a current state is a synchronous state; the comparator is configured to output the state information that the current state is a synchronous state in response to the current count value being consistent with the maximum count threshold, and output the state information that the current state is an asynchronous state in response to the current count value being inconsistent with the maximum count threshold;

the state machine is configured to receive the state information sent by the comparator;

wherein the maximum count threshold is a value obtained by subtracting 1 from a preset frequency division ratio of the clock frequency division module.

13. A system-on-chip, comprising a clock management apparatus, wherein the clock management apparatus is configured to output clock signals for use in the same or different functional modules of the system-on-chip;

the clock management apparatus comprising a clock synchronization signal generator, a plurality of clock gating units, and a plurality of clock frequency division modules;

wherein the clock synchronization signal generator is configured to generate a synchronization signal of a predetermined period;

the plurality of clock gating units are in one-to-one correspondence with the plurality of clock frequency division modules, and each of the plurality of clock gating units is connected in series with a corresponding one of the plurality of clock frequency division modules to form a signal processing branch; a plurality of the signal processing branches are connected in parallel and configured to receive a source clock signal respectively; the clock gating unit is configured to control an on-off switch of the signal processing branch, and the clock frequency division module is configured to perform phase adjustment on a clock signal of the signal processing branch after receiving a synchronization signal output by the clock synchronization signal generator, to adjust clock signals of the plurality of signal processing branches from an asynchronous state to a synchronous state.

14. The system-on-chip according to claim 13, wherein clock signals output by the plurality of signal processing branches are used as operating clocks of a plurality of clock domains respectively.

15. The system-on-chip according to claim 14, wherein the predetermined period is a common multiple of periods of the operating clocks of the plurality of clock domains.

16. The system-on-chip according to claim 13, wherein the clock frequency division module comprises a state machine, a synchronization signal delay circuit, and a clock generation circuit;

wherein the synchronization signal delay circuit is configured to delay a synchronization signal after receiving the synchronization signal output by the clock synchronization signal generator;

the state machine is configured to control the clock generation circuit to, after receiving the delayed synchronization signal, adjust the phase of the output clock in response to the clock signals of the plurality of current signal processing branches being in the asynchronous state.

17. The system-on-chip according to claim 16, wherein the clock frequency division module further comprises a counter and a comparator;

wherein the counter is configured to perform periodic counting under control of the state machine to determine a current count value;

the comparator is configured to compare the current count value with a maximum count threshold of the clock frequency division module, and output state information about whether the current state is a synchronous state; wherein the comparator is configured to output the state information that the current state is the synchronous state in response to the current count value being consistent with the maximum count threshold, and output the state information that the current state is the asynchronous state in response to the current count value being inconsistent with the maximum count threshold;

the state machine is configured to receive the state information sent by the comparator;

wherein the maximum count threshold is a value obtained by subtracting 1 from a preset frequency division ratio of the clock frequency division module.

18. The system-on-chip according to claim 17, wherein the clock frequency division module further comprises a frequency division ratio register configured to store the maximum count threshold.

19. The system-on-chip according to claim 17, wherein the state machine is configured to switch to the asynchronous state after receiving the state information that the current state is the asynchronous state, and control the clock generation circuit to turn off the clock output;

after the counter counts to the maximum count threshold, the state machine is configured to switch to a phase adjustment state, and the counter records a current count value as a phase offset value when a synchronization signal occurs; and when the counter continues to count to the phase offset value, the state machine is configured to control the clock generation circuit to turn on the clock output.

* * * * *